(12) United States Patent
Wei et al.

(10) Patent No.: US 10,652,136 B2
(45) Date of Patent: May 12, 2020

(54) MULTIMODE COMMUNICATION METHOD FOR TRANSMISSION LINE CONDITION MONITORING

(71) Applicants: STATE GRID JIANGSU ELECTRIC POWER COMPANY NANJING POWER SUPPLY COMPANY, Nanjing (CN); STATE GRID JIANGSU ELECTRIC POWER COMPANY, Nanjing (CN); STATE GRID COMPANY CORPORATION OF CHINA, Beijing (CN)

(72) Inventors: Lei Wei, Nanjing (CN); Min Lu, Nanjing (CN); Mingchi Shao, Nanjing (CN); Wei Xu, Nanjing (CN); Qiusheng Li, Nanjing (CN); Chuang Guo, Naning (CN); Dianxin Chen, Nanjing (CN); Dong Yan, Nanjing (CN); Ling Jiang, Nanjing (CN)

(73) Assignees: STATE GRID JIANGSU ELECTRIC POWER COMPANY NANJING POWER SUPPLY COMPANY, Nanjing (CN); STATE GRID JIANGSU ELECTRIC POWER COMPANY, Nanjing (CN); STATE GRID COMPANY CORPORATION OF CHINA, Beijing (CN)

( * ) Notice: Subject to any disclaimer, the term of this patent is extended or adjusted under 35 U.S.C. 154(b) by 232 days.

(21) Appl. No.: 15/323,114

(22) PCT Filed: Apr. 29, 2016

(86) PCT No.: PCT/CN2016/080846
§ 371 (c)(1),
(2) Date: Dec. 29, 2017

(87) PCT Pub. No.: WO2017/156836
PCT Pub. Date: Sep. 21, 2017

(65) Prior Publication Data
US 2018/0167308 A1     Jun. 14, 2018

(30) Foreign Application Priority Data
Mar. 14, 2016  (CN) .......................... 2016 1 0143210

(51) Int. Cl.
*H04W 4/80*     (2018.01)
*G01R 31/387*   (2019.01)
(Continued)

(52) U.S. Cl.
CPC .......... *H04L 45/122* (2013.01); *G01R 31/387* (2019.01); *G08C 17/00* (2013.01);
(Continued)

(58) Field of Classification Search
CPC ..... H04W 4/80; Y02D 70/162; G01R 31/025; G08C 17/00
See application file for complete search history.

(56) References Cited

U.S. PATENT DOCUMENTS

2013/0166081 A1* 6/2013 Sanders ................. G05B 11/01
                                                           700/286
2014/0145858 A1* 5/2014 Miller .................... G08C 17/02
                                                         340/870.07

(Continued)

FOREIGN PATENT DOCUMENTS

CN         102647472        8/2012
CN         102790718       11/2012
(Continued)

*Primary Examiner* — Raj Jain
(74) *Attorney, Agent, or Firm* — Treasure IP Group, LLC

(57) ABSTRACT

This patent relates to a multi-mode communication method for detecting states of power transmission line, which belongs to electric power communication technology field. In this method, there are sensing devices installed on power (Continued)

transmission line. These sensing devices are used to detect status signals of power transmission line. Status signals are sent to remote monitoring center through communication terminals. Both sensing devices and communication terminals are powered by battery. The main communication network between sensing devices and communication terminals is formed by ZigBee network. Meanwhile, Bluetooth network is a backup communication network between sensing devices and communication terminals. Communication terminals and remote monitoring center are linked through WinMAX. This method can take full advantage of these two short-range wireless communication technologies and break limitations of a single technology, ensure reasonable energy consumption, improve efficiency and quality of data transmission.

10 Claims, 1 Drawing Sheet

(51) Int. Cl.
| | | |
|---|---|---|
| *G08C 17/00* | (2006.01) | |
| *H04W 84/18* | (2009.01) | |
| *H04L 12/733* | (2013.01) | |
| *H04L 12/703* | (2013.01) | |
| *H04W 40/22* | (2009.01) | |
| *H04L 12/707* | (2013.01) | |
| *H04W 40/10* | (2009.01) | |
| *H04W 40/12* | (2009.01) | |
| *H04B 1/713* | (2011.01) | |

(52) U.S. Cl.
CPC .............. *H04L 45/22* (2013.01); *H04L 45/28* (2013.01); *H04W 4/80* (2018.02); *H04W 40/10* (2013.01); *H04W 40/12* (2013.01); *H04W 40/22* (2013.01); *H04B 1/713* (2013.01); *H04W 84/18* (2013.01); *Y02D 70/10* (2018.01); *Y02D 70/14* (2018.01); *Y02D 70/144* (2018.01); *Y02D 70/162* (2018.01); *Y02D 70/22* (2018.01); *Y02D 70/40* (2018.01)

(56) References Cited

U.S. PATENT DOCUMENTS

| | | | |
|---|---|---|---|
| 2015/0114942 A1* | 4/2015 | Denis | H04W 4/70 |
| | | | 219/132 |
| 2016/0169959 A1* | 6/2016 | Li | G01R 31/025 |
| | | | 324/552 |
| 2017/0005515 A1* | 1/2017 | Sanders | H02J 3/381 |
| 2018/0167308 A1* | 6/2018 | Wei | H04L 45/28 |

FOREIGN PATENT DOCUMENTS

| | | |
|---|---|---|
| CN | 102883370 | 1/2013 |
| CN | 104964712 | 10/2015 |
| WO | 2012136410 | 10/2012 |

* cited by examiner

MULTIMODE COMMUNICATION METHOD FOR TRANSMISSION LINE CONDITION MONITORING

CROSS REFERENCE TO RELATED APPLICATION

This application is a National Phase application of, and claims priority to, PCT Application No. PCT/CN2016/080846, filed on Apr. 29, 2016 entitled "Multimode Communication Method for Transmission Line Condition Monitoring," which claims priority to Chinese Application No. 201610143210.5, filed on Mar. 14, 2016. Both the PCT Application and Chinese Application are incorporated herein by reference in their entireties.

TECHNOLOGY FIELD

The patent relates to a multi-mode communication method for Power transmission line state monitoring, belongs to electric communication technology field of digital information transmission.

BACKGROUND TECHNOLOGY

Power transmission line is an important part of power system, it is the artery of electric power system. However, long distance transmission wires are basically exposed to the outside, which is vulnerable to be affected by climate, geology and human factors. The pollution flashover, lightning stroke, wire icing and galloping caused huge losses to power grid. Operation states of power transmission line directly determines safety and efficiency of power system.

It is of great significance for realizing intelligent power transmission to monitor operation states of power transmission wire. At present, short distance wireless communication technology is an important supporting technology for power transmission line status monitoring. Among them, ZigBee technology and Bluetooth 4 technology have been rapidly developed in recent years, which has a positive effect on power transmission line status monitoring.

ZigBee technology is a new generation of wireless communication technology developed by IEEE. This technique is mainly aimed at low rate sensor network, which can meet miniaturization and low cost requirements of wireless network. Due to advantages of low power consumption, low cost, large capacity, short delay, self-organizing ability, data security and so on, ZigBee technology has been widely used in many fields, such as medical care, security alarm, wireless ordering, water conservancy monitoring, oil field measurement and control, electric power measurement and control.

Traditional Bluetooth technology is affected by transmission distance, power consumption and other factors, so application of this technology is limited. This status was change by appearance of Bluetooth Technology 4.0. Bluetooth 4.0 has very low operation and standby power consumption, which can make a button battery continuous work for several years. In addition, low cost and cross vendor interoperability, adaptive frequency hopping, 1 Mbps data transfer rate, 3 ms low latency, more than 100 meters long distance, AES-128 encryption and many other features, so Bluetooth 4.0 can be used in many fields, such as pedometer, heart rate monitor, intelligent instrument, internet of things. These fields greatly expand the scope of Bluetooth Technology application.

According to applicant's knowledge:

(1) ZigBee technology also has limitations, such as application of this technology is limited due to low data transmission rate. Although direct sequence spread spectrum technology is used to reduce the loss, this method is lack of ability to resist interference. In addition, the 2.4 GHz band provides less working channel and is easy to cause interference and conflict between nodes.

(2) Compared with ZigBee Technology, Bluetooth 4.0 technology also has its own limitations, such as support less topology structure, single network mode, unsupported mesh networking, low robustness and less accommodating node.

Moreover, energy consumption is one of the main factors that restrict short distance wireless communication technology. Research shows that energy consumption of short distance wireless communication mainly includes two parts: one part is node power consumption that can be solved by using low power nodes. Another part, the biggest part of energy consumption is the energy consumption when node sends and receives data.

Under this background, a lot of energy balancing routing protocols are proposed. Energy consumption of each node can be guaranteed by clustering method to prevent nodes from energy exhaust and stop working due to forwarding data too much. However, the idea of clustering is not suitable for monitoring status data of power transmission line.

Mainly reflected on: (1) there are a limited number of monitoring nodes between each tower, and monitoring nodes are in accordance with Zonal distribution, the method of clustering has little significance. (2) method of clustering is used to divide nodes that monitoring the same object more than others into clusters. However, few nodes monitor the same object along one power transmission line and distribution of nodes is more dispersed, which is not suitable for clustering. Belt monitoring scene of power transmission line determines that the farther away from sink node, the less forwarding times and the less energy consumed. Nodes that the closer to sink node, the more energy consumed by forwarding too much, which leads to these nodes stop working because of energy exhaustion.

At the same time, it is easy to receive multiple forwarding requests in one data forwarding process and trigger forwarding conflict, which cannot guarantee the quality of data transmission and cause low data transmission rate.

Therefore, a forwarding node selection mechanism suitable for monitoring status data of power transmission line is proposed, it is of great significance to balance energy consumption of nodes and prolong service life of the whole network.

SUMMARY OF THE INVENTION

In order to solve deficiencies in existing technologies, this patent proposes a multi-mode communication method to balance energy consumption of communication network nodes, which can prolong service life of the whole network.

The technical proposal for solving these deficiencies in existing technologies is as follows: a multi-mode communication method for monitoring status data of power transmission line, there are sensing devices installed on power transmission line. These sensing devices are used to detect status signals of power transmission line. Status signals are sent to remote monitoring center through communication terminals. Both sensing devices and communication terminals are powered by battery. The main communication network between sensing devices and communication terminals is formed by ZigBee network. Meanwhile, Bluetooth network is a backup communication network between sensing devices and communication terminals. Communication terminals and remote monitoring center are linked through WinMAX.

When any sense device transmits status signals to communication terminal, the sense device should monitor remaining power of battery of three neighbor sensing devices and hops from these devices to communication terminals. Select forwarding device by the following rules:

If hops between its neighbor sensing devices and communication terminal is the same, neighbor sensing device with large residual energy is selected as forwarding device.

If battery residual energy of neighbor sensing devices is the same, neighbor sensing device with minimum hops between its neighbor sensing devices and communication terminal is selected as forwarding device.

If hops from its neighbor sensing devices to communication terminal and battery residual energy of neighbor sensing devices are different, neighbor sensing device with the smallest value of hops divided by battery is selected as forwarding device. If these ratios are the same, neighbor sensing device with large residual energy is selected as forwarding device.

Then, communication network between sensing device and forwarding device is selected according to the following rules: If data signals quantity and signal interference degree of power transmission line to be transmitted are lower than the preset threshold value, and the safety level of power transmission line status signal is higher than the threshold value, the main communication network is selected. Otherwise, the backup communication network is chosen, which takes sensing devices as forwarding device until status signal data of power transmission line is transmitted to communication terminal.

The backup communication network in this patent prefers to choose Bluetooth 4.0 protocol to construct network. Communication terminals send aggregated status data of power transmission line to remote monitoring center by multi-hop communication mode.

The beneficial effect of this patent is: (1) The patent integrates ZigBee technology and Bluetooth technology to transmit status signal data of power transmission line, which can integrate ZigBee technology and Bluetooth 4.0 technology according to requirements of the size and the security of transmitting data. This patent design a method to automatic choose communication network between sensing nodes that monitor status signal data of power transmission line and corresponding forwarding devices as well as adaptive multi-mode communication mode selection. So, this method can effectively remedy the limitation of single communication technology, which enhances the level of status signal data of power transmission line monitoring. (2) This patent relates to a forwarding device selection mechanism based on multi parameters. Considering limitation of energy consumption factors and particularity of status signal data of power transmission line monitoring, this patent proposes a multi parameter forwarding device selection mechanism to ensure reasonable energy consumption of each sensing device and prevent sensing devices from consuming too much energy even stopping work because of forwarding data and, so as to balance node energy consumption and prolong service life of the whole network.

Above technical scheme is easy to receive multiple forwarding requests in one data forwarding process and trigger data forwarding conflict. Therefore, it is helpful to ensure quality of data transmission and improve data transmission rate by choosing appropriate solution. Under such background, this patent provides a method for resolving data forwarding conflict after transmission path is established, that is: Sensing device transmits status data of power transmission line to communication terminal by priority. The priority is divided into three categories: fault status monitoring data, abnormal status monitoring data and normal status monitoring data.

When monitoring status data of power transmission line belongs to the same priority, the following two methods can be used to transmit data: (1) Sensing device transmits that status data to communication terminal according to the priority of monitored object which has preset priority, the monitored object has preset priority. (2) Sensing device transmits status data of power transmission line to communication terminal in time slots according to the method of split time slot.

In addition, if forwarding device (also is sensing device) needs to send its own monitored status data to communication terminal while this forwarding device is transmitting data from its neighbor sensing device to communication terminal at that moment, the forwarding device needs to wait for a data frame to begin to transmit its own monitored status data to communication terminal. Its neighbor sensing device waits for transmitting data until monitored status data of this forwarding device has been transmitted. Then, this device begins to transmit data that did not completely transfer from its neighbor sensing device to communication terminal again, or its neighbor sensing device reselects forwarding device to send status data of power transmission line to communication terminal. Meanwhile, when the residual bandwidth of this forwarding device is enough while does not affect this forwarding device transmitting its own monitored status data, then this forwarding device transmits both its own monitored status data and that of its neighbor sensing device to communication terminal.

When sensing device is transmitting its own monitored status data to communication terminal, and if it receives forwarding request from its neighbor sensing device at that moment (also is forwarding device), this device will continue to transmit the monitored status data of its neighbor sensing device after its own monitored status data of power transmission line has been transmitted. Meanwhile, if it receives forwarding request from its neighbor sensing device while its residual bandwidth is enough to meet its own transmission needs at that moment, then this forwarding device uses its residual bandwidth to transmit the monitored status data of its neighbor sensing device.

The patent relates to a method for solving transmission conflicts based on data priority, focuses on forwarding device selection mechanism based on multi parameter and proposes a method to solve data transmission conflict based on data priority. This method can effectively solve the problem of data transmission conflict, ensure reliable data transmission and improve transmission quality.

DESCRIPTION OF DRAWINGS

Further description of this present patent combined with figures is as follows.

DETAIL DESCRIPTION OF EMBODIMENTS

Implementation Example

In this implementation example, sensing devices are built on power transmission line to detect status signals of that.

These status signals are sent to remote monitoring center through communication terminals. Both sensing devices and communication terminals are powered by battery. The sensing device comprises processor module, Bluetooth 4.0 module, ZigBee module, sensor module and power supply module. Among them, sensor module is responsible for sensing status data of power transmission line (including temperature, wind, tension, contamination and other information) and use for generating status data signal of power transmission line. The communication terminal comprises antenna module, ZigBee module, Bluetooth 4 module, WinMax module, processor module and power supply module. ZigBee module and Bluetooth 4 module are used to meet communication hardware requirements between communication terminal and sensing device. The Win-Max module is responsible for transmitting status data of power transmission line from communication terminal to remote monitoring center. Because of large number of processing data and transmission power, power supply module adopts method of combined power supply of storage battery and solar battery, which generally installed on transmission tower. Sensing device is mounted on both sides of transmission tower.

Figure 1:
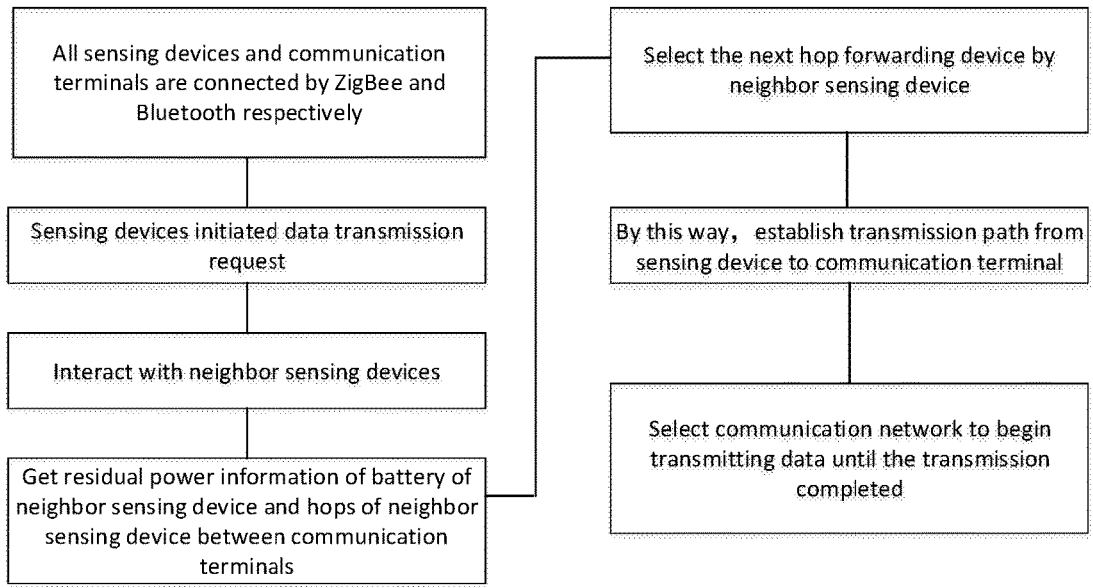
FIG. 1 is the flow chart of this patent.

This example is used to explain the implementation process of multi-mode communication method for monitoring status data of power transmission line, as shown in FIG. 1. The main communication network between sensing devices and communication terminals is formed by ZigBee network. Meanwhile, Bluetooth network is a backup communication network between sensing devices and communication terminals. Communication terminals and remote monitoring center are linked through WinMAX.

When any sense device transmits status signals to communication terminal, the sense device should monitor remaining power of battery of three neighbor sensing devices and hops from these devices to communication terminals. Select forwarding device by the following rules:

If hops between its neighbor sensing devices and communication terminal is the same, neighbor sensing device with large residual energy is selected as forwarding device.

If battery residual energy of neighbor sensing devices is the same, neighbor sensing device with minimum hops between its neighbor sensing devices and communication terminal is selected as forwarding device.

If hops from its neighbor sensing devices to communication terminal and battery residual energy of neighbor sensing devices are different, neighbor sensing device with the smallest value of hops divided by battery is selected as forwarding device. If these ratios are the same, neighbor sensing device with large residual energy is selected as forwarding device.

Then, communication network between sensing device and forwarding device is selected according to the following rules: If data signals quantity and signal interference degree of power transmission line to be transmitted are lower than the preset threshold value, and the safety level of power transmission line status signal is higher than the threshold value, the main communication network is selected. Otherwise, the backup communication network is chosen that is: select appropriate communication technology for data transmission, In the case of small amount of data, little interference, high security level, the use of ZigBee technology communication In the case of small amount of data, little interference, high level of security requirements uses ZigBee communication technology, while in the case of large data, more interference uses Bluetooth communication technology.

In this way, whole communication network mode can be one kind of the two technologies: ZigBee or Bluetooth, and can also be mixed use of the two technologies on different path segments (A point to B point uses ZigBee transmission technology, B point to C point uses Bluetooth transmission technology). Forwarding device is considered as sensing device for transmitting status data signal of power transmission line. Status data signal of power transmission line is transmitted to communication terminal, and so on.

The example of this patent establishes transmission path through above method. In this way, energy consumption of each device can be guaranteed, and never appear phenomenon of data return back, which can prevent device on the shortest path from energy exhaustion due to too many forwarding times and monitoring work from being affected. In transmission process, when forwarding device is suddenly unavailable for various reasons, last hop device of forwarding device follows the same procedure to find forwarding device for data transmitting.

Figure 2:
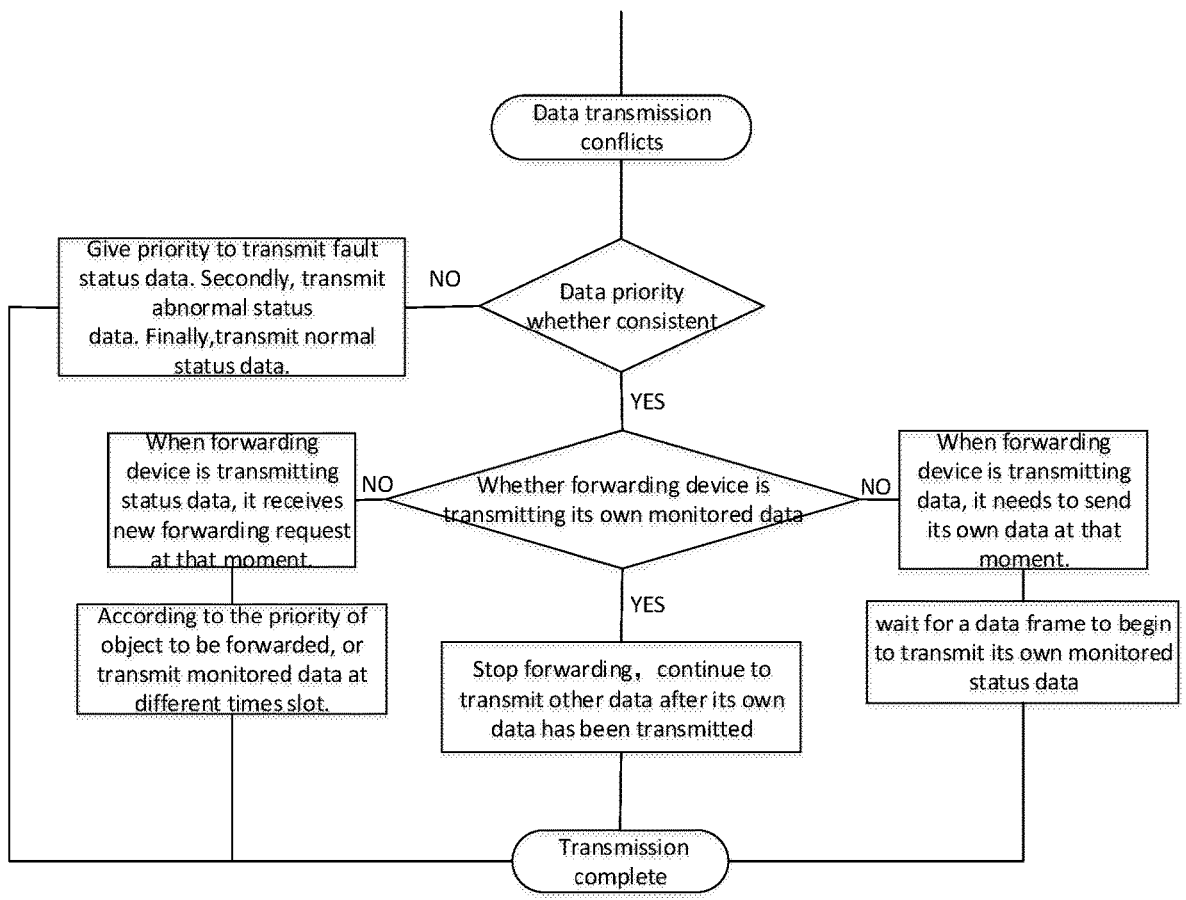
FIG. 2 is the flow chart of dealing with data transmission conflict in this patent.

This example is easy to receive multiple forwarding requests in one data forwarding process and trigger data forwarding conflict. Therefore, it is helpful to ensure quality of data transmission and improve data transmission rate by choosing appropriate solution. The example makes following improvements, the method for resolving data forwarding conflict after transmission path is established, that is: as shown in FIG. 2, sensing device transmits status data of power transmission line to communication terminal by priority. The priority is divided into three categories: fault status monitoring data, abnormal status monitoring data and normal status monitoring data.

When monitoring status data of power transmission line belongs to the same priority, the following two methods can be used to transmit data: (1) Sensing device transmits that status data to communication terminal according to the priority of monitored object which has preset priority, the monitored object has preset priority. (2) Sensing device transmits status data of power transmission line to communication terminal in time slots according to the method of split time slot.

In addition, if forwarding device (also is sensing device) needs to send its own monitored status data to communication terminal while this forwarding device is transmitting data from its neighbor sensing device to communication terminal at that moment, the forwarding device needs to wait for a data frame to begin to transmit its own monitored status data to communication terminal. Its neighbor sensing device waits for transmitting data until monitored status data of this forwarding device has been transmitted. Then, this device begins to transmit data that did not completely transfer from its neighbor sensing device to communication terminal again, or its neighbor sensing device reselects forwarding device to send status data of power transmission line to communication terminal. Meanwhile, when the residual bandwidth of this forwarding device is enough while does not affect this forwarding device transmitting its own monitored status data, then this forwarding device transmits both its own monitored status data and that of its neighbor sensing device to communication terminal.

When sensing device is transmitting its own monitored status data to communication terminal, and if it receives forwarding request from its neighbor sensing device at that moment (also is forwarding device), this device will continue to transmit the monitored status data of its neighbor sensing device after its own monitored status data of power transmission line has been transmitted. Meanwhile, if it receives forwarding request from its neighbor sensing device while its residual bandwidth is enough to meet its own transmission needs at that moment, then this forwarding device uses its residual bandwidth to transmit the monitored status data of its neighbor sensing device.

The patent is not limited to the above example. Any equivalent substitution formed technical scheme that used fall in the scope of protection required by this invention.

We claim:

1. A multi-mode communication method for monitoring status of a power transmission line,

[1] said power transmission line includes
a plurality of sensing devices, installed on the power transmission line, configured to
monitor status of the power transmission line thereof,
obtain power transmission line status signals, and
send the power transmission status signals to a communication terminal;
a communication terminal, configured to
collect the power transmission status signals from the plurality of the sensing devices; and
send the power transmission line status signals collected to a remote monitor center;
wherein the plurality of sensing devices and the communication terminal are powered by batteries;
wherein
the plurality of sensing devices and the communication terminal are organized to form a primary communication network in accordance with a ZigBee network format, and
the plurality of sensing devices and the communication terminal are organized to form a backup communication network using a Bluetooth network;
the communication terminal and the remote monitoring center are linked according to WinMAX network format;

[2] the method comprising
in a step of sending a power line status signal to the communication terminal, by any of the plurality of the sensing device, comprising
as first set of steps,
identifying three neighbor sensing devices for one of the plurality of the sensing device;
monitoring remaining battery capacity power for the three neighbor sensing devices;
monitoring the distance hop count value (a number of hops) between each of the three neighbor sensing device and the communication terminal,

[3] selecting a forwarding device according to the following rules:
1) when the numbers of hops from each of the three neighbor sensing devices to the communication terminal are the same,
selecting the neighbor sensing devices having a highest remaining battery power as the forwarding device;
2) when the remaining battery power of the three neighbor sensing device are the same,
selecting the neighbor sensing device having a least number of hops from the communication terminal as the forwarding device;
3) when the numbers of hops from the three neighbor sensing devices to the communication terminal are different, and at the same time,
the remaining battery powers of the three neighbor sensing devices are not the same,
selecting the neighbor sensing device having a smallest ratio of the number of hops to the remaining battery power (hop counts/remaining battery power) as the forwarding device;
selecting the neighbor sensing device having a highest remaining battery power as the forwarding device, when the ratios are the same for all three neighbor sensing devices;

[4] selecting a communication network between the one of the plurality of the sensing device and the corresponding forwarding device according to the following rules:
if both, an amount data to be sent and degree of interference, of the transmission line status signal to be transmitted, are lower than a predetermined threshold, and the security level of the transmission line status signal to be transmitted is higher than a preset value,
then selecting the primary communication network as the communication network between the one of the plurality of the sensing device and the corresponding forwarding device,
otherwise, selecting the backup communication network as the communication network between the one of the plurality of the sensing device and the corresponding forwarding device; and

[5] subsequently, taking the forwarding device as a sensing device for the transmission line status signal to be transmitted, and performing the steps continuously until the transmission line status signals are all sent to the communication terminal.

2. The method of claim 1, further comprising
transmitting the power transmission line status signals to the communication terminal by the plurality of the sensing devices according to monitored data priorities,
wherein the monitored data of the power transmission line status signals are classified into three categories, monitored data of a fault status, monitored data of an abnormal status, and monitored data of a normal status, from the priorities from high to low.

3. The method of claim 2, further comprising
transmitting the power transmission line status signals, by the plurality of the sensing devices, to the communication terminal, according to a priority of a monitoring target, which has a preset priority, when the monitored data of the power transmission line status signals are in the same category of priority.

4. The method of claim 2, further comprising
transmitting the power transmission line status signals, by the plurality of the sensing devices, to the communication terminal, in time slots, according to a method of split time slot.

5. The method of claim 2, wherein
when one forwarding device needs to
send its own monitored data to the communication terminal while said forwarding device is transmitting a forwarded data, from its neighbor sensing device, to the communication terminal at the same time,
the forwarding device needs to wait till one data frame of the forwarded data to be finished transmitting,
then begin to transmit its own monitored data to the communication terminal; and
in the meanwhile, for the neighbor sensing device of the forwarding device,
it waits until the monitored data of the forwarding device has been finished transmitting, then begins to transmit remaining data, that has not been completely transferred from the neighbor sensing device to the communication terminal, to the forwarding device, or it reselects a new forwarding device to send its monitored data of power transmission line to communication terminal.

6. The method of claim 2, wherein when one forwarding device needs to send its own monitored data to the communication terminal while said forwarding device is transmitting a forwarded data, from its neighbor sensing device, to the communication terminal at the same time, then the forwarding device transmits both its own monitored data and the forwarded data, from its neighbor sensing device, to the communication terminal concurrently, under a condition that remaining bandwidth of the forward device is enough so that transmitting the forwarded data concurrently does not affect said forwarding device transmitting its own monitored data.

7. The method of claim 2, wherein when the forwarding device is transmitting its own monitored data to the communication terminal, and it receives a forwarding request from its neighbor sensing device, said forwarding device will continue to transmit its own monitored data until it finishes before forwarding monitored data from its neighbor sensing device.

8. The method of claim 2, wherein when the forwarding device is transmitting its own monitored data to the communication terminal, and it receives a forwarding request from its neighbor sensing device, said forwarding device will uses its remaining bandwidth to transmit the monitored data of its neighbor sensing device when the forwarding device has more than enough bandwidth for it to transmit its own monitored data.

9. The method of claim 1, wherein the backup communication network is organized by Bluetooth 4.0 protocol.

10. The method of claim 1, wherein said communication terminal send, the collected data of the power transmission line status to the remote monitoring center, by a multi-hop communication manner.

* * * * *